(12) United States Patent
Huang

(10) Patent No.: US 6,744,297 B2
(45) Date of Patent: Jun. 1, 2004

(54) INVERTER CIRCUIT

(75) Inventor: Chao-Sheng Huang, Taipei (TW)

(73) Assignee: Via Technologies, Inc. (TW)

( * ) Notice: Subject to any disclaimer, the term of this patent is extended or adjusted under 35 U.S.C. 154(b) by 0 days.

(21) Appl. No.: 10/412,988

(22) Filed: Apr. 14, 2003

(65) Prior Publication Data

US 2003/0222697 A1 Dec. 4, 2003

(30) Foreign Application Priority Data

Jun. 3, 2002 (TW) ........................................ 91111884 A

(51) Int. Cl.[7] ................................................. H03K 5/08
(52) U.S. Cl. ...................... 327/324; 327/112; 327/328; 327/312; 326/121; 326/122
(58) Field of Search ................. 327/108, 112, 327/309, 312, 313, 314, 323, 324, 327, 328, 170, 427; 326/70, 71, 83, 116, 121, 122

(56) References Cited

U.S. PATENT DOCUMENTS 4,490,633 A * 12/1984 Noufer et al. ................. 326/71
4,617,482 A * 10/1986 Matsuda ...................... 327/391
5,066,930 A * 11/1991 Morse .......................... 333/164
5,149,991 A * 9/1992 Rogers ........................ 326/27
6,617,903 B2 * 9/2003 Kawamura .................. 327/112

* cited by examiner

*Primary Examiner*—Long Nguyen
(74) *Attorney, Agent, or Firm*—Madson & Metcalf

(57) ABSTRACT

An inverter circuit includes an input end receiving an input signal having a low level and a high level, wherein the low level is greater than zero, a P-channel metal-oxide-semiconductor (PMOS) transistor having a gate electrode coupled to the input end and a source electrode coupled to a voltage source, a first N-channel metal-oxide-semiconductor (NMOS) transistor having a drain electrode coupled to a drain electrode of the PMOS transistor to serve as an output end, and a source electrode thereof coupled to ground, and a voltage drop device coupled to the gate electrode of the first NMOS transistor and the input end to provide a voltage drop from the input end to the gate electrode of the first NMOS transistor, thereby eliminating a current leakage of the first NMOS transistor at the low level of the input signal.

9 Claims, 6 Drawing Sheets

INVERTER CIRCUIT

FIELD OF THE INVENTION

The present invention relates to an inverter circuit, and more particularly to an inverter circuit for use in an integrated circuit (IC).

BACKGROUND OF THE INVENTION

Please refer to FIG. 1 which is a circuit diagram showing a conventional complementary metal-oxide-semiconductor (CMOS) inverter. The CMOS inverter includes an N-channel metal-oxide semiconductor (NMOS) transistor 11 and a P-channel metal-oxide semiconductor (PMOS) transistor 12. When an input signal is a perfect bi-level signal, for example having a low level of 0 V and a high level of 2.5 V, the current is generated only at the transition state other than the steady state.

However, the input signal is not always perfect. When the low level of the input signal is far from the perfect 0 V, e.g. 0.75 or even 0.9 V, the NMOS transistor 12 will be slightly turned on, resulting in the current leakage. Thus, the power consumption of the CMOS inverter largely increases.

Therefore, the purpose of the present invention is to develop an inverter circuit for use in an integrated circuit to deal with the above situations encountered in the prior art.

SUMMARY OF THE INVENTION

An object of the present invention is to provide an inverter circuit for efficiently preventing the current leakage from occurrence and decreasing the power consumption.

According to an aspect of the present invention, there is provided an inverter circuit includes an input end receiving an input signal having a low level and a high level, wherein the low level is greater than zero, a P-channel metal-oxide-semiconductor (PMOS) transistor having a gate electrode coupled to the input end and a source electrode coupled to a voltage source, a first N-channel metal-oxide-semiconductor (NMOS) transistor having a drain electrode coupled to a drain electrode of the PMOS transistor to serve as an output end, and a source electrode thereof coupled to ground, and a voltage drop device coupled to the gate electrode of the first NMOS transistor and the input end to provide a voltage drop from the input end to the gate electrode of the first NMOS transistor, thereby eliminating a current leakage of the first NMOS transistor at the low level of the input signal.

In an embodiment, the voltage drop device is a diode having an anode coupled to the input end, and a cathode commonly coupled to ground with the gate electrode of the first NMOS transistor. Preferably, the diode is implemented by a second NMOS transistor having a gate electrode and a drain electrode commonly coupled to the input end, and a source electrode commonly coupled to ground with the gate electrode of the first NMOS transistor. Preferably, the source electrode of the second NMOS transistor and the gate electrode of the first NMOS transistor are coupled to ground via a third NMOS transistor. The third NMOS transistor has a drain electrode coupled to the source electrode of the second NMOS transistor and the gate electrode of the first NMOS transistor. A source electrode of the third NMOS transistor is coupled to ground, and a gate electrode of the third NMOS transistor is coupled to the output end.

In an embodiment, the inverter circuit further includes a fourth NMOS transistor and a fifth NMOS transistor. The fourth NMOS transistor has a drain electrode and a source electrode connected to the source electrode of the second NMOS transistor and the drain electrode of the third NMOS transistor in series, respectively. A gate electrode of the fourth NMOS transistor is coupled to the input end. The fifth NMOS transistor has a gate electrode coupled to both the drain electrode of the fourth NMOS transistor and the source electrode of the second NMOS transistor. A drain electrode and a source electrode of the fifth NMOS transistor are coupled to the output end and ground, respectively. Preferably, the second and fourth NMOS transistors are substantially of the same size. Preferably, the first NMOS transistor has a channel wider than a channel of the fifth NMOS transistor.

For example, the low level lies between about 0.7 and about 0.9 V, and the high level is about 2.5 V.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
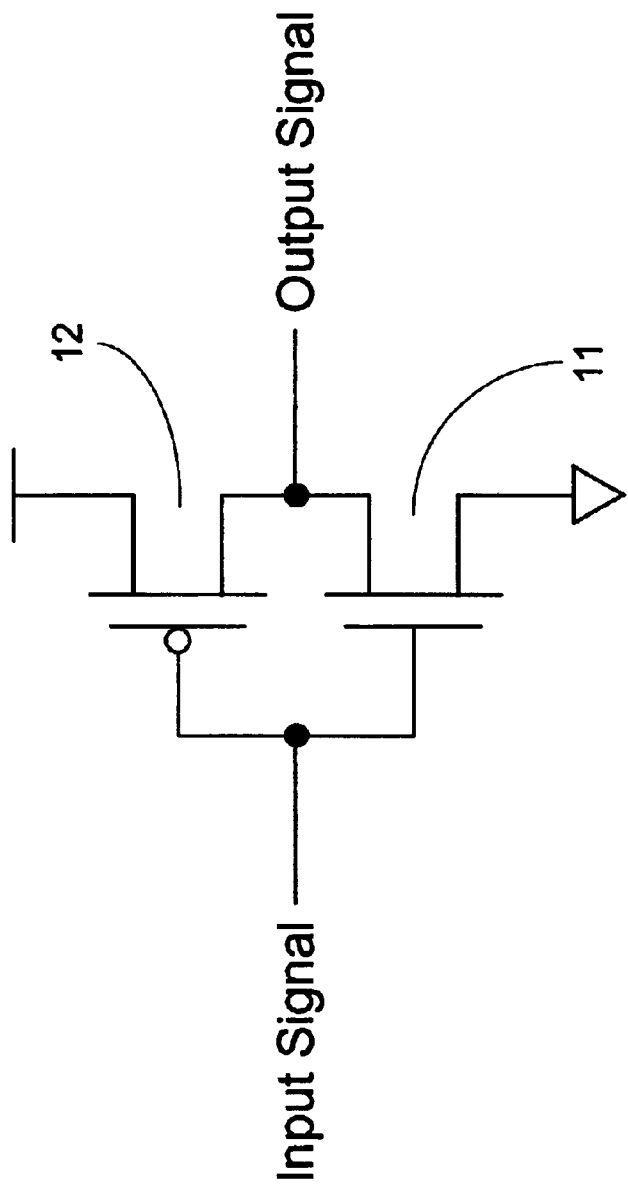
FIG. 1 is a circuit diagram illustrating a conventional CMOS inverter.
Figure 2:
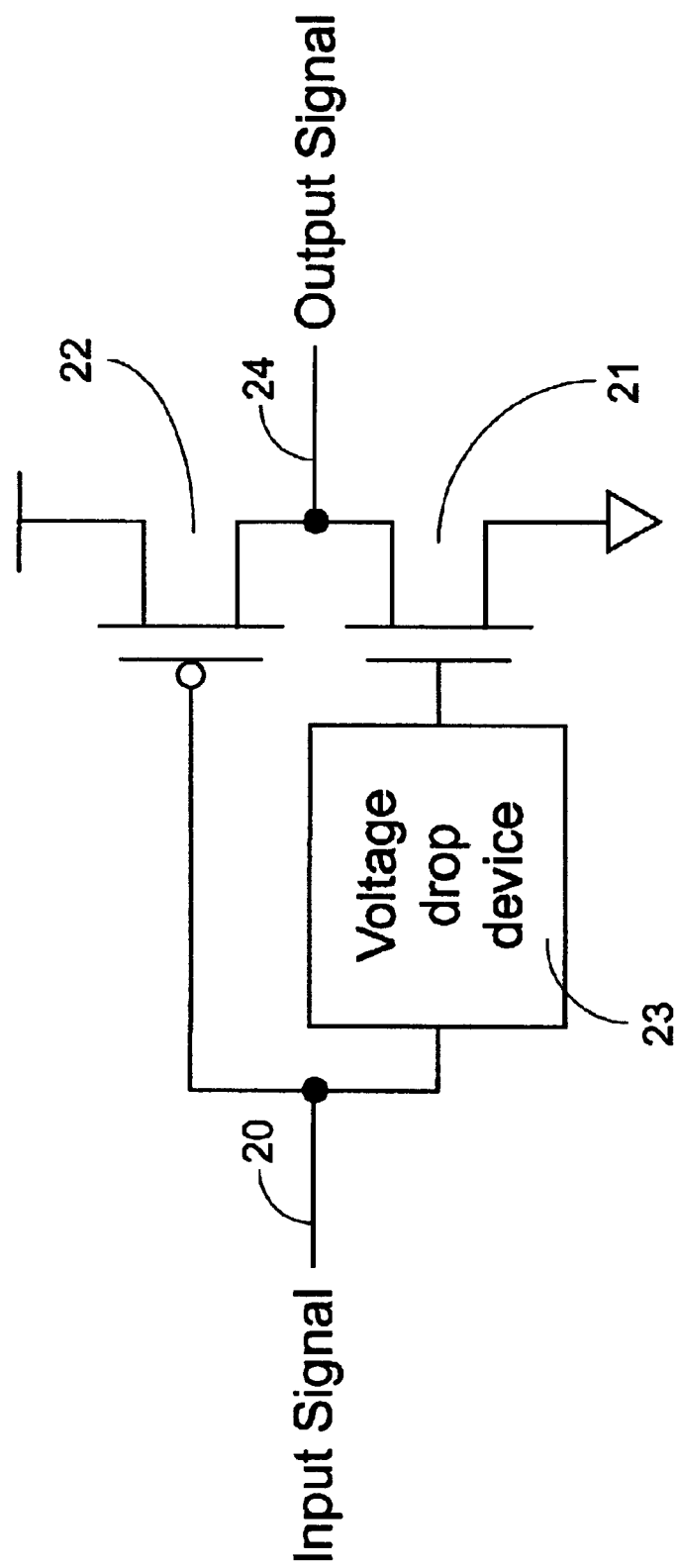
FIG. 2 is a schematic circuit diagram illustrating a preferred embodiment of an inverter circuit according to the present invention.

Please refer to FIG. 2 which is a schematic circuit diagram illustrating a preferred embodiment of an inverter circuit according to the present invention. The inverter circuit includes an N-channel metal-oxide-semiconductor (NMOS) transistor 21, a P-channel metal-oxide-semiconductor (PMOS) transistor 22 and a voltage drop device 23. As shown in FIG. 2, the voltage drop device 23 is disposed between the gate electrode of the NMOS transistor 21 and an input end 20 for providing a voltage drop from the input end 20 to the gate electrode of the NMOS transistor 21 in order to prevent from possible current leakage of the NMOS transistor 21, particularly when the input signal is at a low level, e.g. 0.75~0.9 V.

Figure 3:
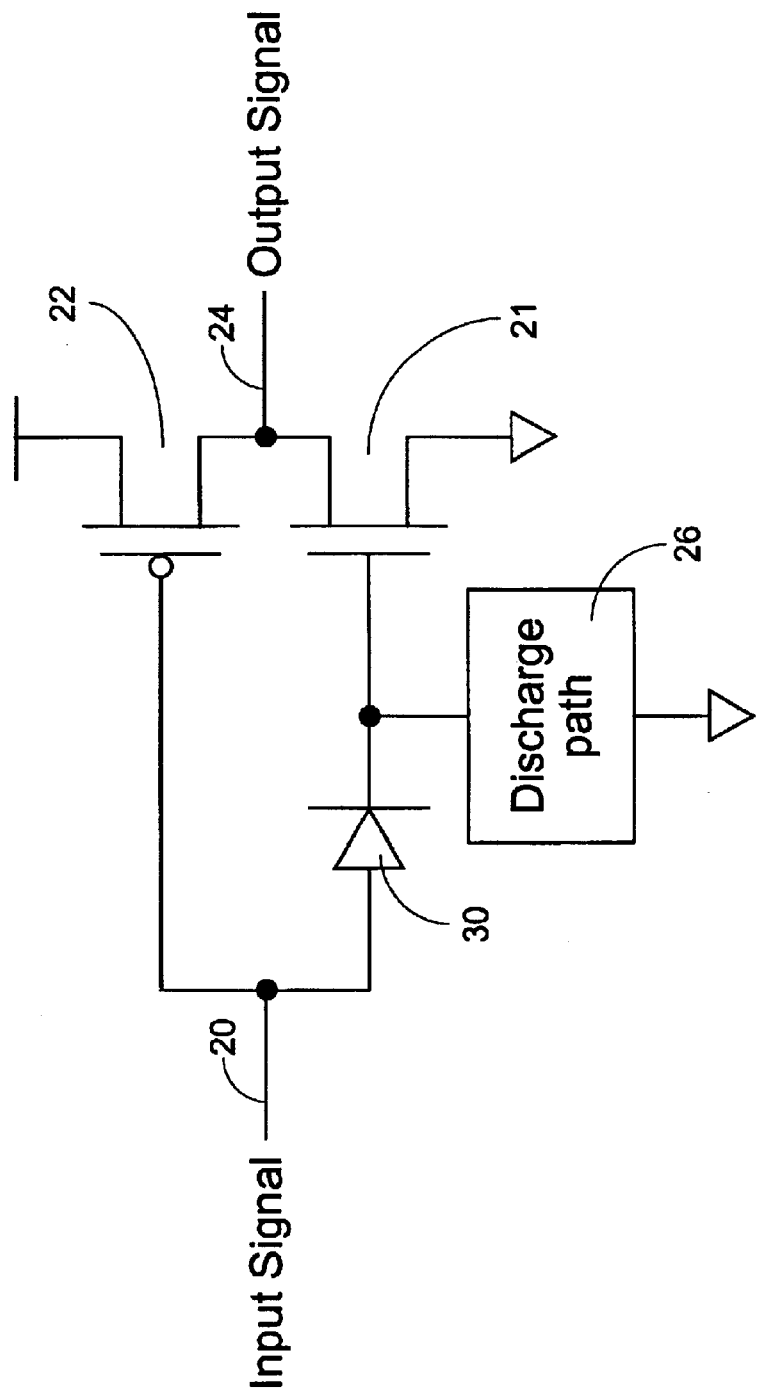
FIG. 3 is a schematic circuit diagram illustrating a preferred embodiment of a voltage drop device of the inverter circuit of FIG. 2.

The voltage drop device 23 of FIG. 2 is implemented by a diode 30 of FIG. 3 according to a preferred embodiment of the present invention. The anode of the diode 30 is coupled to the input end 20 and the cathode thereof is coupled to a discharge path 26 common to the gate electrode of the NMOS transistor 21 for achieving voltage drop effect. The diode 30 at least provides a voltage drop of 0.7 V from the input end 20 to the gate electrode of the NMOS transistor 21, thereby eliminating the current leakage.

Figure 4:
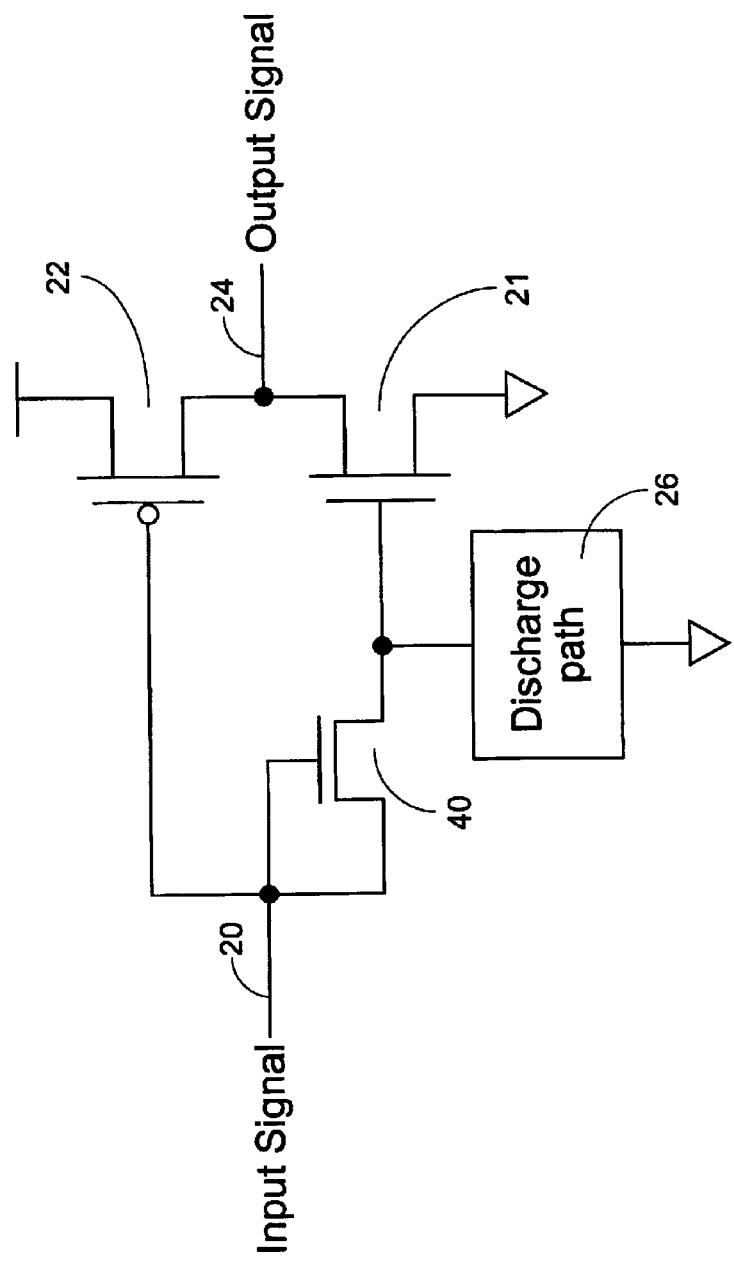
FIG. 4 is a schematic circuit diagram illustrating another preferred embodiment of a voltage drop device of the inverter circuit of FIG. 2.

Please refer to FIG. 4 which is a schematic circuit diagram illustrating another preferred embodiment of a voltage drop device of the inverter circuit of FIG. 2. The structure and function of the inverter circuit in FIG. 4 are similar to those of FIG. 3 except that the voltage drop device is an NMOS transistor 40 instead of the diode 30 of FIG. 3. The gate and drain electrodes of the NMOS transistor 40 are commonly coupled to the input end 20. The source electrode of the NMOS transistor 40 and the gate electrode of the NMOS transistor 21 are commonly coupled to a discharge path 26 to function for achieving voltage drop effect.

Figure 5:
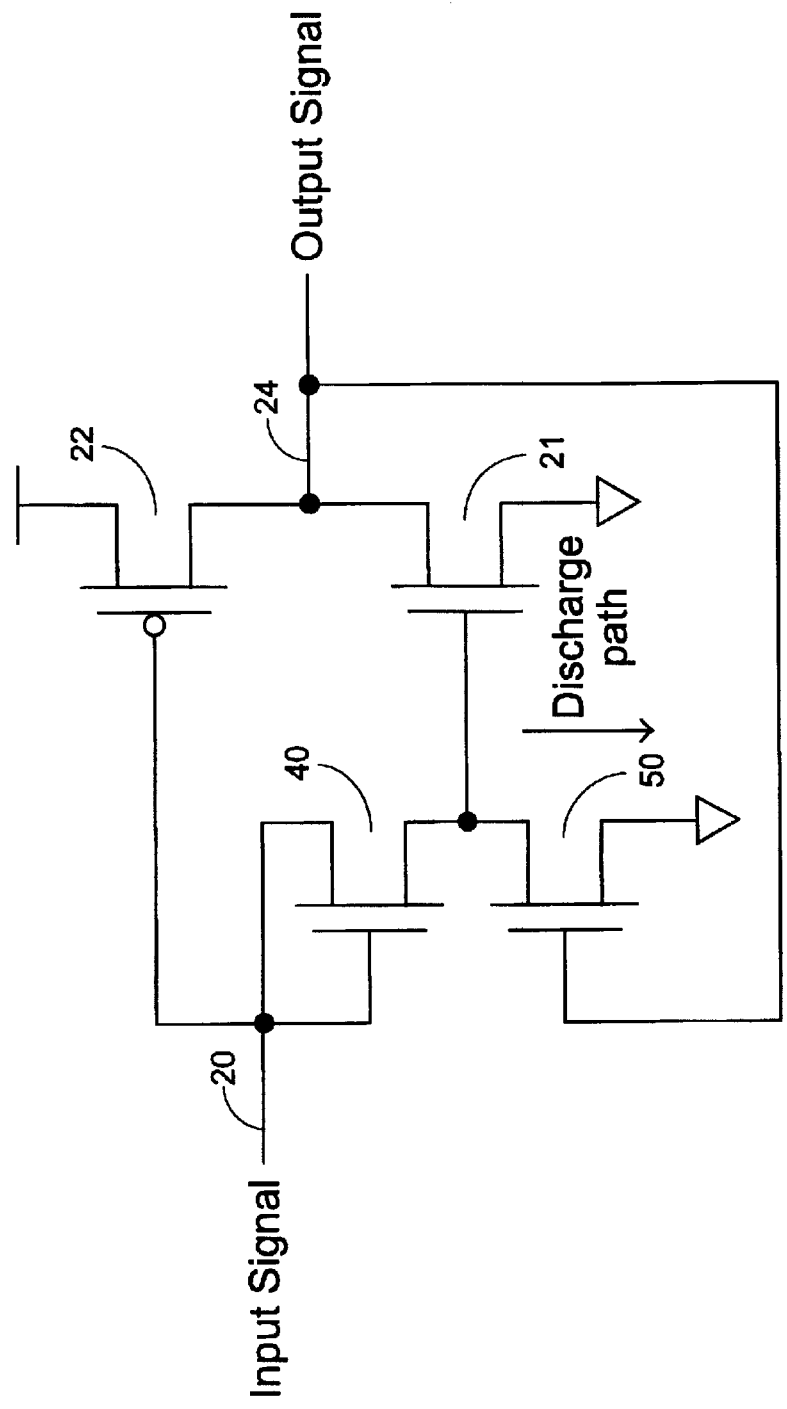
FIG. 5 is a circuit diagram illustrating another preferred embodiment of an inverter circuit according to the present invention.

FIG. 5 is a schematic circuit diagram illustrating another preferred embodiment of an inverter circuit according to the present invention. The structure and function of the inverter circuit in FIG. 5 are similar to those of FIG. 2 except that the inverter circuit of FIG. 5 involves in a closed-loop control. The source electrode of the NMOS transistor 40 and the gate electrode of the NMOS transistor 21 are coupled to ground via an NMOS transistor 50. The drain electrode of the NMOS transistor 50 is coupled to the source electrode of the NMOS transistor 40 and the gate electrode of the NMOS transistor 21, the source electrode of the NMOS transistor 50 is coupled to ground, and the gate electrode of the NMOS transistor 50 is coupled to an output end 24. Since the NMOS transistor 40 is diode-connected, it is considered as a voltage drop device. Hence, when the input signal is at a low level, e.g. 0.7 to 0.9 V, the gate electrode of the NMOS transistor 50 generates a discharge path to ground due to the feedback of the output signal. On the other hand, when the input signal is at a high level, e.g. 2.5 V, the discharge path does not exist because the NMOS transistor 50 is switched off. In such way, the gate electrode of the NMOS transistor 21 is kept at a high level voltage of 2.5 V so as to not affect the operation of the NMOS transistor 21.

Figure 6:
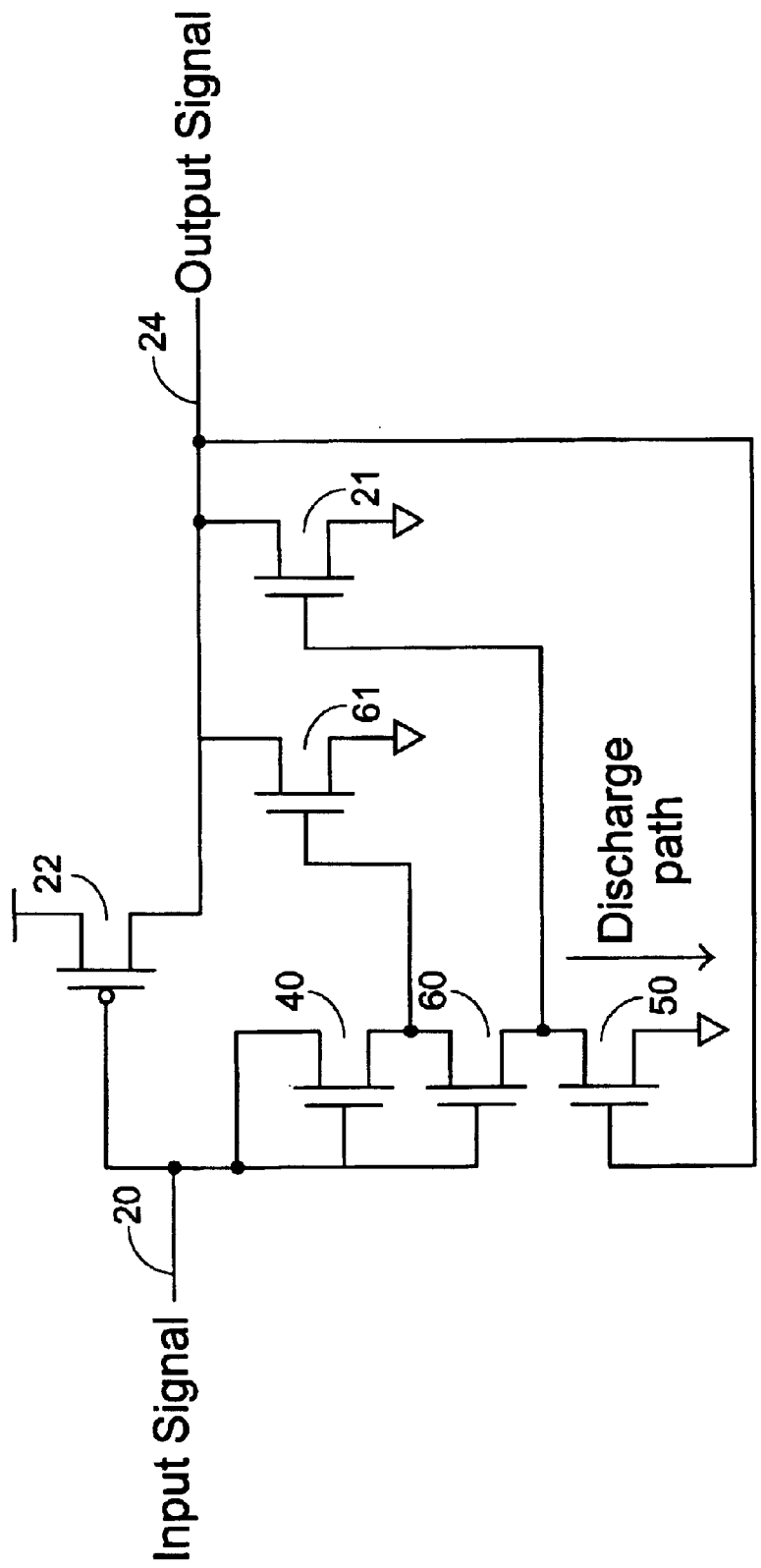
FIG. 6 is a circuit diagram illustrating a further preferred embodiment of an inverter circuit according to the present invention.

Please refer to FIG. 6 which is a circuit diagram illustrating a further preferred embodiment of an inverter circuit according to the present invention. As shown in FIG. 6, the inverter circuit further includes two NMOS transistors 60 and 61 besides the NMOS transistors 21, 40 and 50 in FIG. 5. The drain electrode and the source electrode of the NMOS transistor 60 are connected to the source electrode of the NMOS transistor 40 and the drain electrode of the NMOS transistor 50 in series, respectively. The gate electrode of the NMOS transistor 60 is coupled to the input end 20. The gate electrode of the NMOS transistor 61 is commonly coupled to the drain electrode of the NMOS transistor 60 and the source electrode of the NMOS transistor 40. The drain electrode and the source electrode of the NMOS transistor 61 are coupled to the output end 24 and ground, respectively. Meanwhile, the size of the NMOS transistor 60 can be similar with that of the NMOS transistor 40. The channel width of the NMOS transistor 21 is greater than that of the NMOS transistor 61.

Since the NMOS transistor 40 is diode-connected as mentioned above, it could cause slight current leakage of the NMOS transistor 21 if the low-level voltage is still higher than zero. Hence, for assuring of substantially no current leakage of the NMOS transistor 21, the NMOS transistor 60 as shown in FIG. 6 is provided for further voltage drop at the gate electrode of the NMOS transistor 21.

To sum up, the inverter circuit according to the present invention can efficiently avoid the current leakage occurrence even thought the low level of the input signal is far from the perfect 0 V, e.g. 0.75 or even 0.9 V. Thus, the power consumption of the CMOS inverter can be largely decreased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An inverter circuit comprising:

an input end receiving an input signal having a low level and a high level, wherein said low level is greater than zero volt;

a P-channel metal-oxide-semiconductor (PMOS) transistor having a gate electrode coupled to said input end and a source electrode coupled to a voltage source;

a first N-channel metal-oxide-semiconductor (NMOS) transistor having a drain electrode coupled to a drain electrode of said PMOS transistor to serve as an output end, and a source electrode thereof coupled to ground;

a voltage drop device coupled to said gate electrode of said first NMOS transistor and said input end to provide a voltage drop from said input end to said gate electrode of said first NMOS transistor;

a discharge path coupled between said voltage dray device and around for facilitating voltage drop effect of said voltage drop device, thereby eliminating a current leakage of said first NMOS transistor at said low level of said input signal; and a fourth N-channel metal-oxide-semiconductor (NMOS) transistor having a drain electrode and a source electrode connected to said voltage drop device and said discharge path in series, respectively, and a gate electrode coupled to said input end for further voltage drop.

2. The inverter circuit according to claim 1 wherein said diode voltage drop device is a second NMOS transistor having a gate electrode and a drain electrode commonly coupled to said input end, and a source electrode coupled to said drain electrode of said fourth NMOS transistor.

3. The inverter circuit according to claim 2 wherein discharge path is implemented by a third NMOS transistor having a drain electrode coupled to said source electrode of said fourth NMOS transistor and said gate electrode of said first NMOS transistor, a source electrode coupled to ground, and a gate electrode coupled to said output end.

4. The inverter circuit according to claim 3 further comprising a fifth NMOS transistor having a gate electrode coupled to both said drain electrode of said fourth NMOS transistor and said source electrode of said second NMOS transistor, and a drain electrode and a source electrode coupled to said output end and ground, respectively.

5. The inverter circuit according to claim 4 wherein said second and fourth NMOS transistors are substantially of the same size.

6. The inverter circuit according to claim 4 wherein said first NMOS transistor has a channel wider than a channel of said fifth NMOS transistor.

7. The inverter circuit according to claim 1 wherein said low level lies between about 0.7 and about 0.9 V, and said high level is about 2.5 V.

8. An inverter circuit comprising:

an input end receiving an input signal having a low level and a high level, wherein said low level is greater than zero volt;

a P-channel metal-oxide-semiconductor (PMOS) transistor having a gate electrode coupled to said input end and a source electrode coupled to a voltage source;

a first N-channel metal-oxide-semiconductor (NMOS) transistor having a drain electrode coupled to a drain electrode of said PMOS transistor to serve as an output end, and a source electrode thereof coupled to ground;

a voltage drop device coupled to said gate electrode of said first NMOS transistor and said input end to provide a voltage drop from said input end to said gate electrode of said first NMOS transistor;

a discharge path coupled between said voltage drop device and ground for facilitating voltage drop effect of said voltage drop device, thereby eliminating a current leakage of said first NMOS transistor at said low level of said input signal;

a second N-channel metal-oxide-semiconductor (NMOS) transistor having a drain electrode and a source electrode connected to said voltage drop device and said discharge path in series, respectively, and a gate electrode coupled to said input end for further voltage drop; and a third N-channel metal-oxide-semiconductor (NMOS) transistor having a gate electrode coupled to both said drain electrode of said second NMOS transistor and said voltage drop device, and a drain electrode and a source electrode coupled to said output end and ground, respectively.

9. An inverter circuit capable of eliminating current leakage when the low level of an input signal is greater than zero volt, comprising:

an input end for receiving therefrom an input signal;

a P-channel metal-oxide-semiconductor (PMOS) transistor having a gate electrode coupled to said input end and a source electrode coupled to a voltage source;

a first N-channel metal-oxide-semiconductor (NMOS) transistor having a drain electrode coupled to a drain electrode of said PMQS transistor to serve as an output end, and a source electrode thereof coupled to ground;

a second NMOS transistor having a gate electrode and a drain electrode commonly coupled to said input end, and a source electrode coupled said gate electrode of said first NMOS transistor;

a third NMOS transistor having a drain electrode coupled to said source electrode of said second NMOS transistor and said gate electrode of said first NMOS transistor, a source electrode coupled to ground, and a gate electrode coupled to said output end;

a fourth NMOS transistor having a drain electrode and a source electrode connected to said source electrode of said second NMOS transistor and said drain electrode of said third NMOS transistor in series, respectively, and a gate electrode coupled to said input end; and a fifth NMOS transistor having a gate electrode coupled to both said drain electrode of said fourth NMOS transistor and said source electrode of said second NMOS transistor, and a drain electrode and a source electrode coupled to said output end and ground, respectively.

* * * * *

UNITED STATES PATENT AND TRADEMARK OFFICE
CERTIFICATE OF CORRECTION

PATENT NO.     : 6,744,297 B2
DATED          : June 1, 2004
INVENTOR(S)    : Chao-Sheng Huang It is certified that error appears in the above-identified patent and that said Letters Patent is hereby corrected as shown below:

Column 4,
Line 32, please delete "dray" and replace with -- drop --.
Line 33, please delete "around" and replace with -- ground --.
Line 43, please delete "diode".

Column 6,
Line 10, please delete "PMQS" and replace with -- PMOS --.

Signed and Sealed this

Twenty-third Day of November, 2004

JON W. DUDAS
*Director of the United States Patent and Trademark Office*